(12) United States Patent
Angelucci

(10) Patent No.: US 8,988,172 B1
(45) Date of Patent: Mar. 24, 2015

(54) INTEGRATED ELECTRONIC STRUCTURE

(71) Applicant: Lockheed Martin Corporation, Bethesda, MD (US)

(72) Inventor: Marc T. Angelucci, Cherry Hill, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/846,130

(22) Filed: Mar. 18, 2013

Related U.S. Application Data

(62) Division of application No. 11/823,148, filed on Jun. 26, 2007, now Pat. No. 8,400,368.

(51) Int. Cl.
*H01P 3/08* (2006.01)
*H01Q 1/20* (2006.01)
*H01Q 1/48* (2006.01)
*H01Q 1/12* (2006.01)

(52) U.S. Cl.
CPC .. *H01P 3/08* (2013.01); *H01Q 1/48* (2013.01); *H01Q 1/1221* (2013.01)
USPC .......................................... 333/238; 343/872

(58) Field of Classification Search
CPC ......... H01P 1/203; H01P 5/028; H01P 5/184; H01Q 1/20; H01Q 1/1207; H01Q 1/1221
USPC .......... 333/204, 205, 238; 343/841, 846, 847, 343/848, 872, 884, 898, 700 MS
See application file for complete search history.

(56) References Cited

U.S. PATENT DOCUMENTS

| | | | |
|---|---|---|---|
| 3,569,973 A | | 3/1971 | Brumbaugh et al. |
| 4,614,947 A | | 9/1986 | Rammos |
| 4,758,841 A | | 7/1988 | Grim |
| 5,129,099 A | * | 7/1992 | Roberts ........................... 455/81 |
| 5,278,574 A | * | 1/1994 | Zimmerman et al. ......... 343/778 |
| 5,347,241 A | * | 9/1994 | Panaretos et al. .............. 333/1.1 |
| 6,043,785 A | * | 3/2000 | Marino ......................... 343/767 |
| 6,255,917 B1 | | 7/2001 | Scott |
| 7,280,848 B2 | * | 10/2007 | Hoppenstein ................. 455/561 |
| 7,936,230 B2 | * | 5/2011 | Pietig et al. .................... 333/1.1 |
| 8,160,705 B2 | * | 4/2012 | Stevenson et al. .............. 607/32 |

\* cited by examiner

*Primary Examiner* — Robert Pascal
*Assistant Examiner* — Gerald Stevens
(74) *Attorney, Agent, or Firm* — Howard IP Law Group, PC

(57) ABSTRACT

A multifunction electronics member combining structural and electronics functions includes in one embodiment an elongate longitudinally-extending structural body configured to support a structural load and including a first support base, a stiffening projection, and a first electrical circuit supported by the first support base. The circuit preferably is embedded between the first circuit base and a cover to form an electrically-active, or in some embodiments passive, structural member.

12 Claims, 9 Drawing Sheets

INTEGRATED ELECTRONIC STRUCTURE

RELATED APPLICATIONS

This application is a divisional application of co-pending U.S. patent application Ser. No. 11/823,148, filed Jun. 26, 2007, entitled Integrated Electronic Structure, the entirety of which is incorporated herein by reference for all purposes.

FIELD OF INVENTION

The present invention relates to mechanical structures for housing and supporting electronic/electrical components, and more particularly to improved load-bearing and non-load bearing multifunction structures with integrated or embedded electronics.

BACKGROUND OF THE INVENTION

The design of load-bearing and non-load bearing mechanical structures necessary for supporting and housing various electronic/electrical and microwave components and hardware has received separate treatment from the design of the electronics in the past. One approach, for example, has been to design and build the mechanical structures (e.g. structural shapes, frames, doors, etc.) separately as a discrete step from the design and fabrication of the electronic components (e.g. striplines, line replaceable units (LRUs), connectors, wiring harnesses, power supplies, RF distribution and beamforming hardware, etc.). The separate electronic components/hardware are therefore fabricated separately, and then must be attached to the supporting structure typically by surface mounting using fasteners, mechanical connections, adhesives, or other suitable means. This has resulted in electronic equipment that inefficiently utilizes space with larger than necessary component housings, increased weight, and higher product costs due to separately designed/procured materials and more complex assembly requirements and touch labor to attach the electronics to the supporting structure.

Accordingly, there remains a need for more efficient and cost-effective integration of the mechanical structural and electronics functions in electronic components and hardware.

SUMMARY OF INVENTION

The present invention overcomes the foregoing problems by integrating the mechanical structural and electronics functions concurrently during the design and fabrication stage. According to one aspect of the invention, multifunction mechanical structures (load-bearing and non-load bearing) are provided with integrated or embedded electronic components incorporated into the structures themselves. The preferred embodiments described herein may be used for integrated multifunction mechanical structures made of metals, plastics, fiberglass, composite materials, or any other suitable materials.

In one embodiment, an integrated multifunction mechanical structure with integrated electronics according to principles of the present invention includes: an elongate metallic structural body capable of withstanding an applied external structural load, a portion of the body defining a first electrical groundplane; and a first circuit board layered on top of the first groundplane and having an electrical conductor. In one embodiment, the integrated multifunction mechanical structure may further include a first cover having a metal surface defining a second electrical groundplane, the first cover layered on top of the first circuit board. In one embodiment, the body, first circuit board, and first cover are joined and embedded together to define a stripline. In another embodiment, the body, first circuit board, and first cover are permanently or irremovably joined together to form a monolithic single unit that is electrically active. The structural body defines a longitudinal axis and preferably includes a stiffening projection disposed transverse to the longitudinal axis to strengthen the body. In one embodiment, the body includes a surface facing the first circuit board that forms an electrical groundplane. In another embodiment, the surface includes a plurality of channels recessed into the surface that are filled by air to form a dielectric for a suspended air stripline. In other embodiments, the multifunction member includes a second stripline embedded in the body.

In another embodiment, a multifunctional structural member with embedded electronics includes: an elongate longitudinally-extending structural body capable of supporting a structural load and having at least one metal surface defining a first circuit base, the body defining a longitudinal axis; and a first longitudinally-extending electrical circuit supported by the first circuit base. In some embodiments, a first longitudinally-extending cover is attached on top of the circuit and facing the electrical circuit. The circuit may be embedded between the first circuit base and first cover to form an electrically-active structural member in one embodiment. In some embodiments, the circuit is permanently embedded. In another embodiment, the electrical circuit may be a circuit board including a dielectric substrate and metallic electrical conductor supported by the substrate. The metal surface of the structural body may define a first groundplane. In one embodiment, the structural body is preferably made of metal, and more preferably aluminum in one possible embodiment. In another embodiment, the first cover includes at least one metal surface facing the circuit, which may define a second groundplane. The multifunction member may further include a second longitudinally-extending circuit embedded between a second circuit base defined by the structural body and a second cover. The second cover preferably includes a metal surface facing the second circuit base. In one embodiment, the first circuit and second circuits are spaced apart from each other and connected by at least one stiffening projection disposed transverse to the longitudinal axis. In another embodiment, a second stiffening projection is provided. The first and second circuits together with the two stiffening projections may define an internal cavity to provide an air conduit for moving cooling air through the structural member to dissipate heat from the circuits.

In another embodiment, a multifunctional structural member with electronics includes: a longitudinally-extending structural body defining a longitudinal axis and being capable of supporting an external applied load, the body including at least one stiffening projection disposed transversely to the longitudinal axis for strengthening the body; and at least one electrical circuit embedded in a portion of the body to form an electrically-active structural member capable of withstanding applied external loads. The structural body preferably includes electrical connectors coupled to the embedded electrical circuit in one embodiment. In one embodiment, the electrical circuit contains an electrical conductor made of metal. In another embodiment, the body is made of a metal and the body forms part of the embedded electrical circuit. In other embodiments, the body is made of a metal and the body forms part of the embedded electrical circuit; the metal used to make the body being different than the metal used to make the conductor.

In another embodiment, a multifunctional structural member with electronics includes: a longitudinally-extending structural body defining a longitudinal axis and being capable of supporting an external applied load, the body having two sides; a pair of spaced-apart longitudinally-extending electrical circuit boards incorporated into the body, the circuit boards and sides defining an internal cavity therebetween; and a plurality of apertures extending through at least one side and communicating with the internal cavity. The internal cavity may define an airflow conduit for cooling the circuit boards. In one embodiment, the structural member may be a component used in an antenna array. In one embodiment, the body is metal. In another embodiment, the circuit boards form part of striplines.

According to another possible embodiment, a stripline capable of supporting a structural load is provided that includes a structural body having a structural cross-sectional shape and at least one stiffening projection or flange to add rigidity to the body. In some embodiments, the structural body may have a cross-sectional shape selected from a box shape, I-shape, T-shape, C-shape, or various combinations thereof.

In still a further embodiment, an antenna structure or module includes: a frame; and at least one multifunction structural member with integrated electronics mounted in the frame. The multifunctional member includes an elongate metallic structural body capable of withstanding an applied external structural load, a portion of the body defining a first electrical groundplane and a first circuit board layered on top of the first groundplane and having an electrical conductor. In one embodiment the body and the first circuit board are joined and embedded together to define a stripline.

Use of the terms electronic and electrical with reference to circuits or circuit boards herein may be interpreted to be used interchangeably and include any type of circuits or circuit boards containing any type of electrical conductors or electronic components used for example without limitation power supply and conditioning, signal processing, control, microwave and RF transmission/receiving, etc. Accordingly, the invention is not limited in its possible applications.

BRIEF DESCRIPTION OF THE DRAWINGS

The features of the preferred embodiments will be described with reference to the following drawings where like elements are labeled similarly, and in which.

DETAILED DESCRIPTION OF THE INVENTION

In the description of embodiments of the invention disclosed herein, any reference to direction or orientation is merely intended for convenience of description and is not intended in any way to limit the scope of the present invention. Moreover, the features and benefits of the invention are illustrated by reference to preferred embodiments. Accordingly, the invention expressly should not be limited to such preferred embodiments illustrating some possible but non-limiting combination of features that may be provided alone or in other combinations of features; the scope of the invention being defined by the claims appended hereto.

Figure 1:
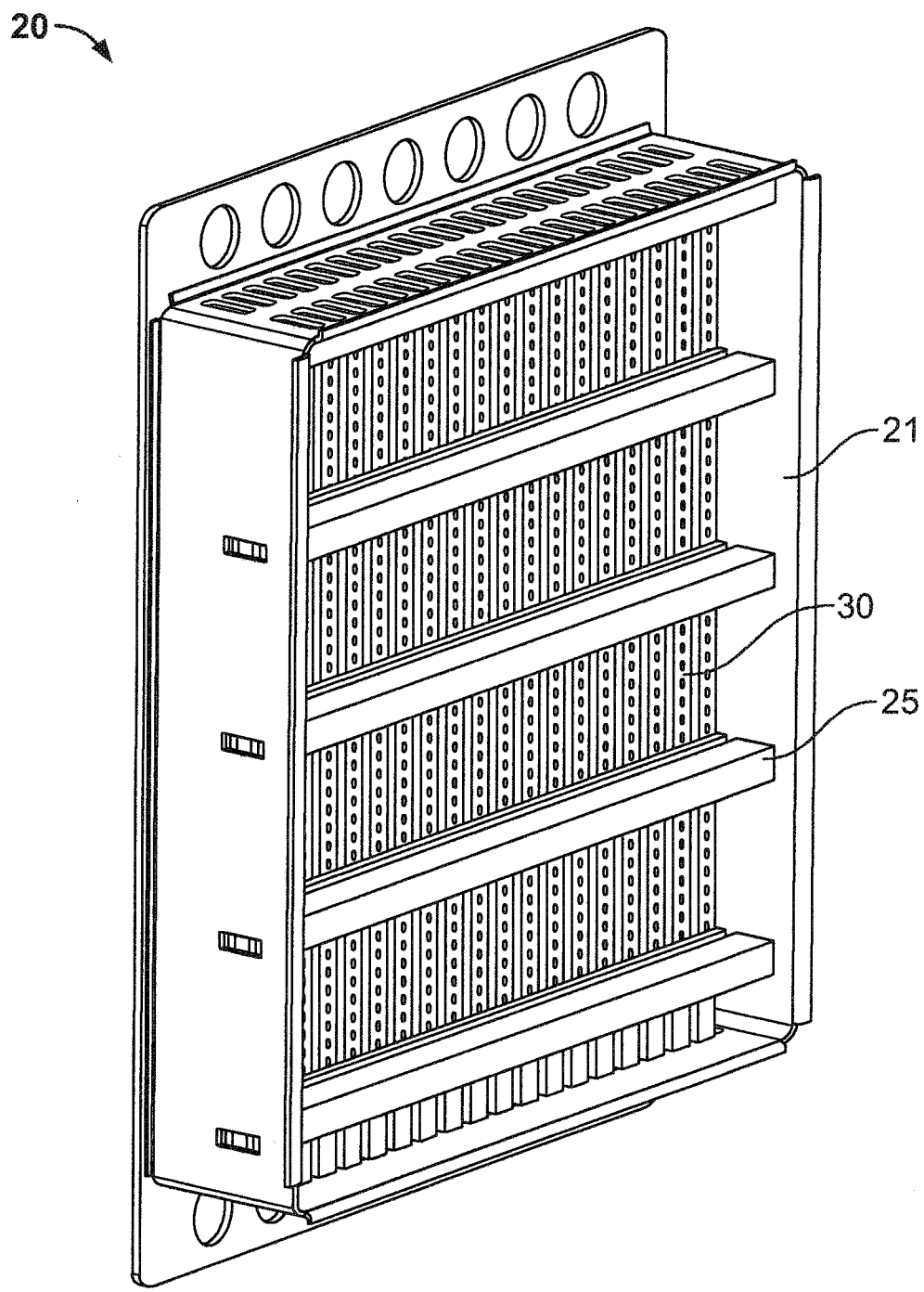
FIG. 1 is a front perspective view of a preferred embodiment of an antenna array module comprised of a plurality of multifunction structural electronic members with electronics according to principles of the present invention.
Figure 2:
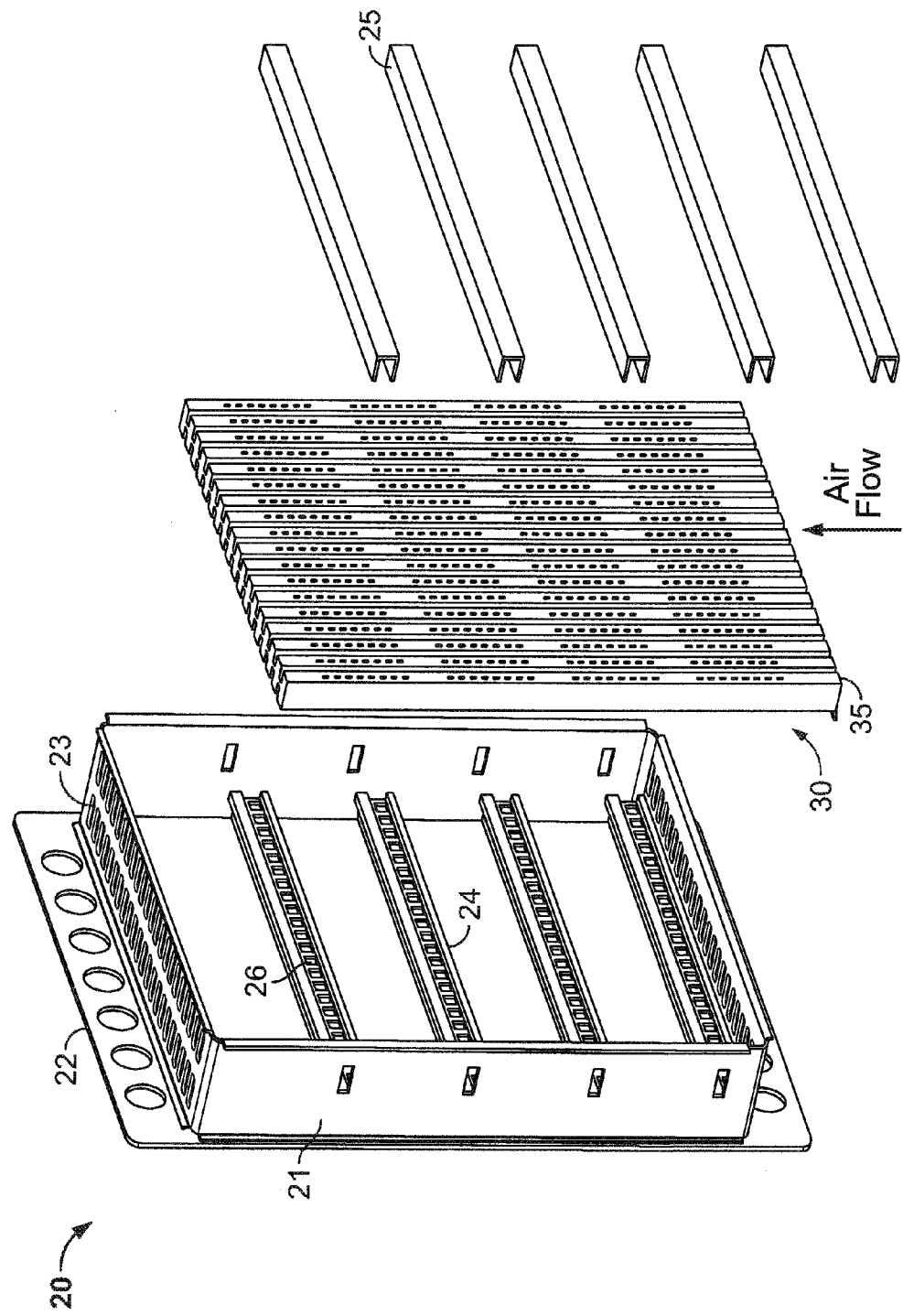
FIG. 2 is an exploded front perspective view of the module and components of FIG. 1.

Referring to FIGS. 1 and 2, one embodiment of an integrated multifunction mechanical structural member with incorporated or embedded electronics/electrical circuitry according to principles of the present invention is illustrated in the form of an air-cooled phased array antenna structure or module. In the embodiment shown, the embedded electronics includes without limitation suspended air striplines. FIG. 2 shows an exploded view of the structure shown in FIG. 1

The antenna structure 20 generally includes a frame 21 formed of any suitable material, a mounting flange 22, and plurality of slotted air entry/exit passages 23 at the top and bottom of the frame. A plurality of vertically-oriented multifunction integrated structural members 30 are provided that efficiently combine both structural, cooling, and electronic functions, as explained herein. The multifunction structural members 30 are removably mounted in frame 21 and may be held in place by front and rear horizontal brackets 24, 25 as shown. Brackets 24 may contain a plurality of electrical connectors 26 to mate with complementary connectors on other components as described herein. Multifunction members 30 combine and incorporate numerous mechanical, structural, and electronic functions into a single component, such as without limitation for example a main airflow conduit, vertical antenna structure, vertical beamforming and RF distribution, and structural support of the electronic hardware.

Figure 3:
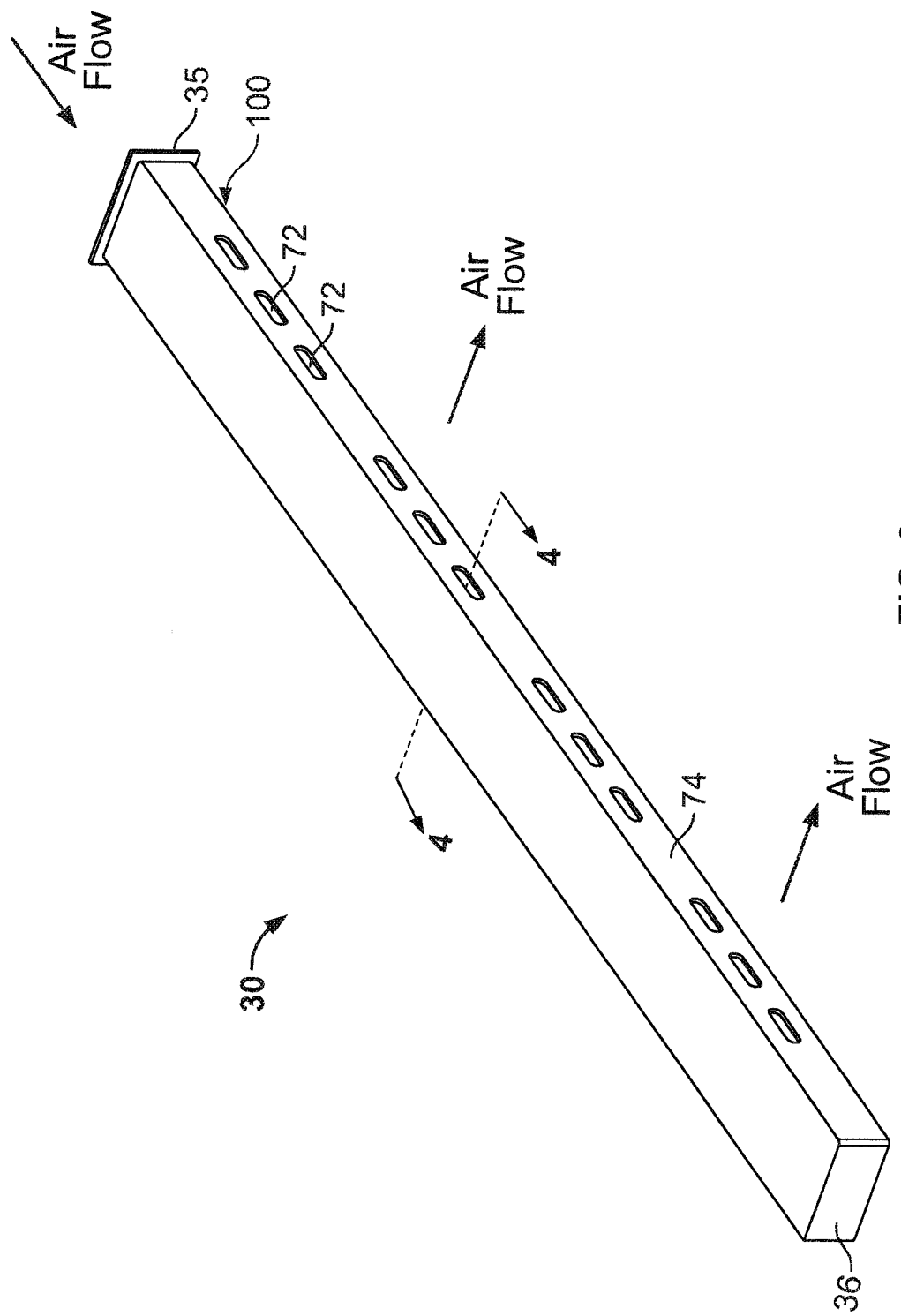
FIG. 3 is a perspective view of the multifunction structural member of FIG. 1 with top cover and circuit board of a top stripline in exploded view.
Figure 4:
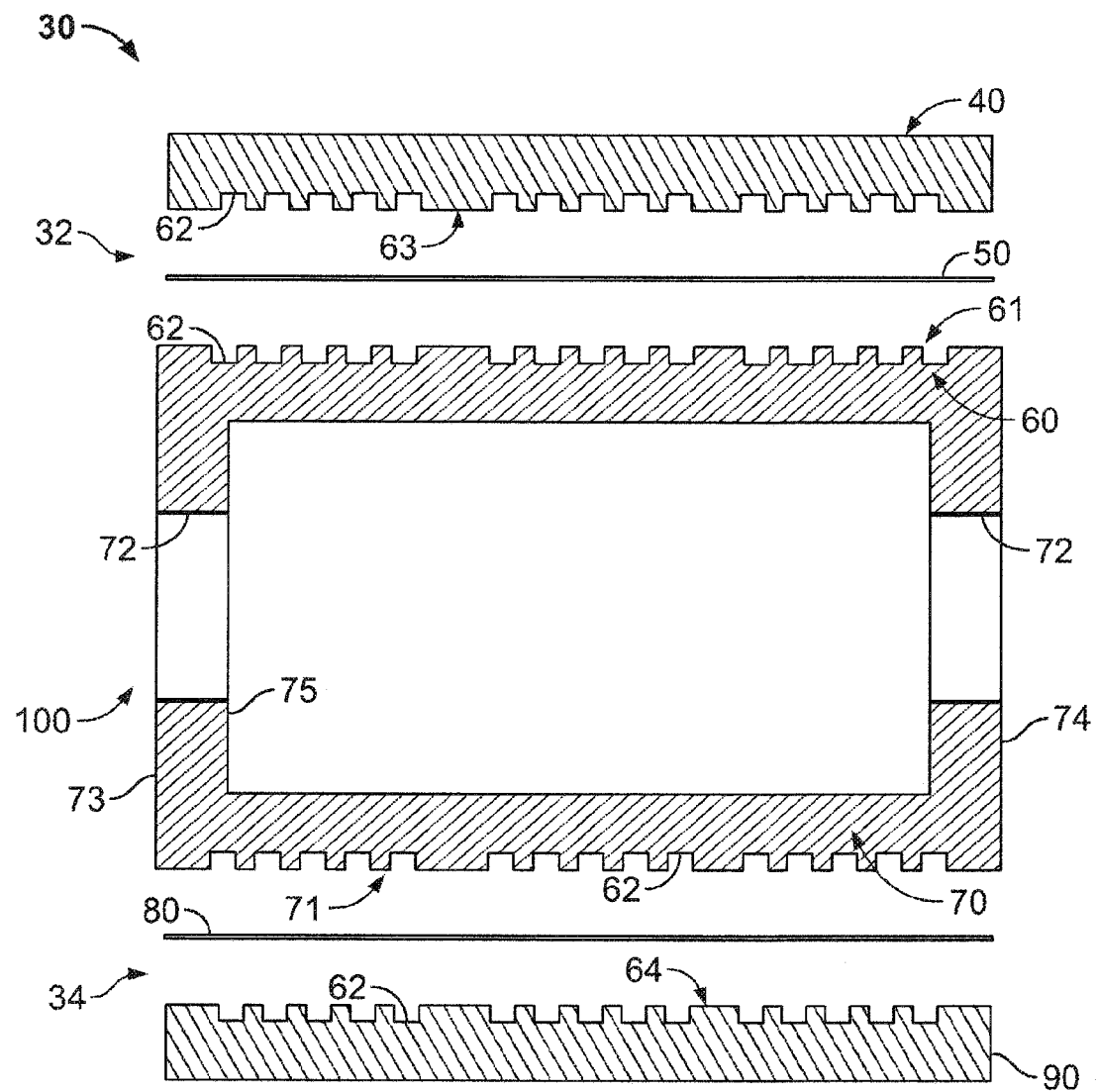
FIG. 4 is a full cross-section taken through the multifunction structural member of FIG. 3 along line 4-4 showing top and bottom striplines in exploded view.

FIG. 3 shows a single multifunction structural member 30 from the antenna module of FIG. 1, oriented horizontally for convenience. FIG. 4 shows a lateral cross-sectional exploded view through multifunction member 30. Multifunction member 30 generally includes a structural body 100, a pair of circuit boards 50 and 80 each defining an electrical circuit, top cover 40, top circuit support base 60, bottom circuit support base 70, and bottom cover 90. The circuit boards 50, 80, covers 40, 90, and circuit supports 60, 70 each respectively define top and bottom suspended air striplines 32, 34. In one embodiment, circuit supports 60, 70 are formed on different parts of a single structural body 100. Internal surfaces 61, 63 and 64, 71 on either side of circuit boards 50, 80 respectively are preferably made of metal or metal clad to form electrical groundplanes for striplines 32, 34. Some suitable metals or cladding that may be used for the internal surfaces include without limitation aluminum, steel, titanium, brass, copper, nickel, etc. and various metal alloy combinations of the former or other metals, and metalized plastics or composites.

Figure 5:
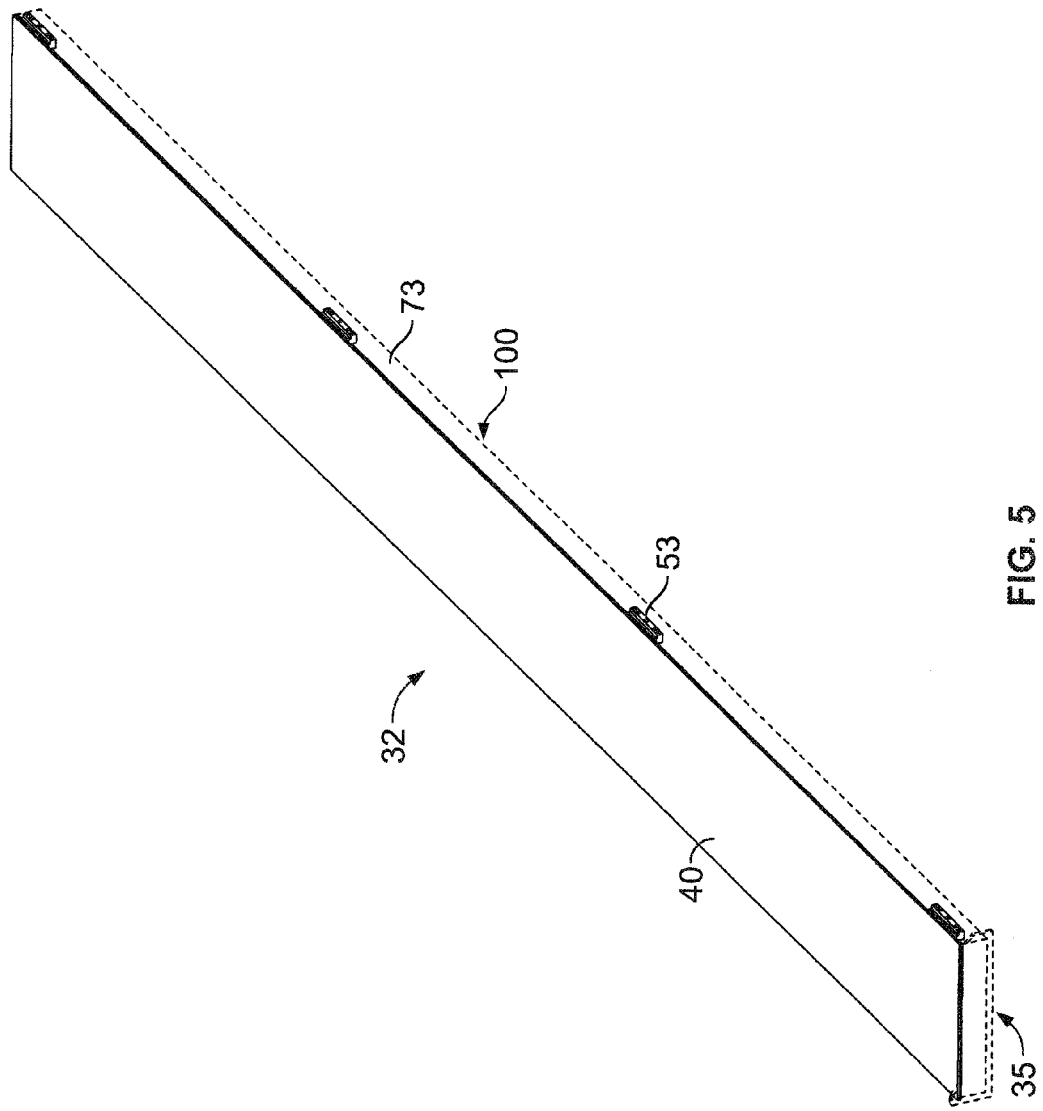
FIG. 5 is a perspective view of the assembled top stripline of FIG. 3 but shown in a reversed orientation to reveal the electrical connectors.
Figure 8:
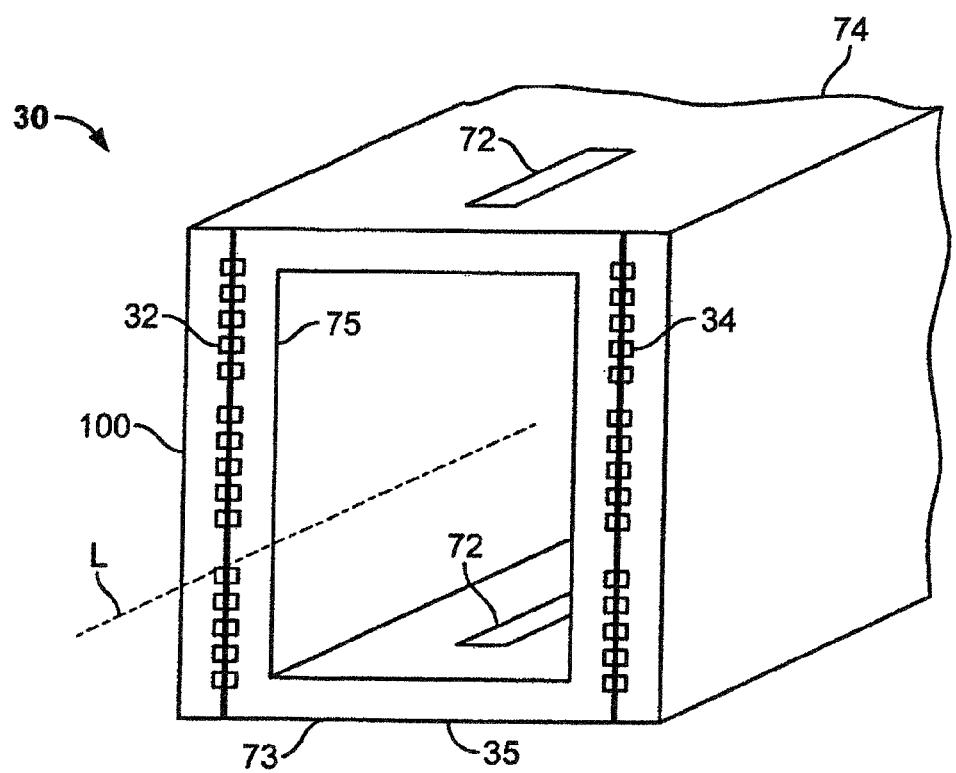
FIG. 8 is a cross-sectional view of the assembled multifunction structural member of FIG. 3, rotated 90 degrees.
Figure 9:
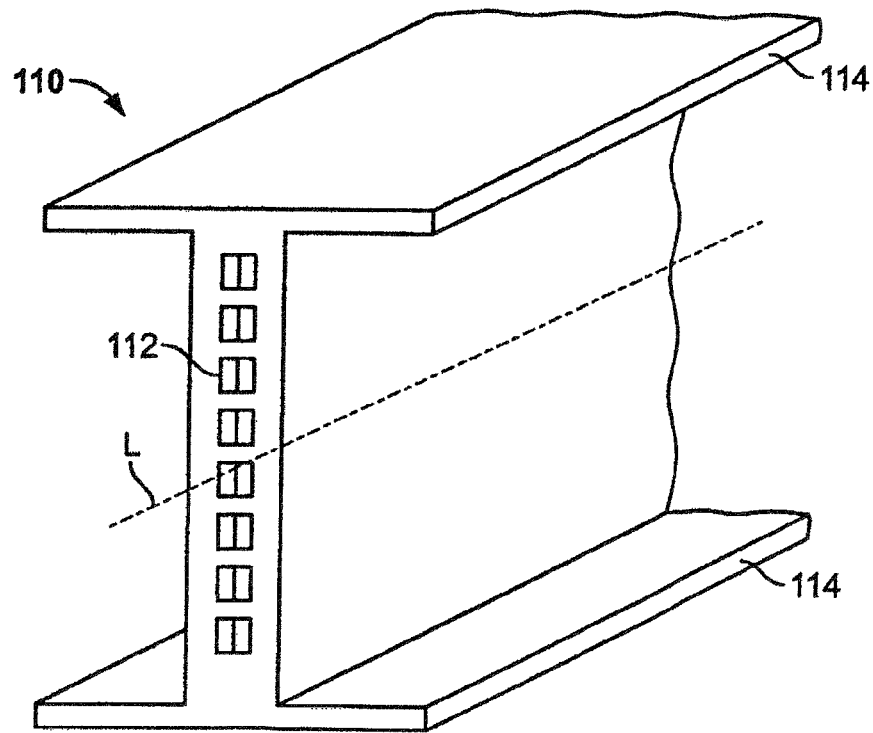
FIG. 9 is a cross-sectional view through an alternative I-shaped multifunction structural member.
Figure 10:
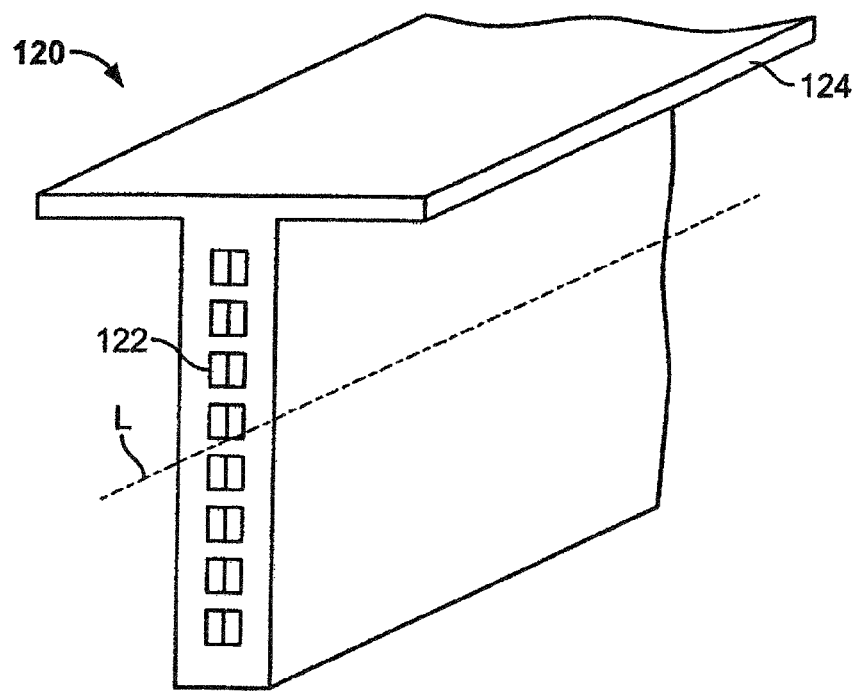
FIG. 10 is a cross-sectional view through an alternative T-shaped multifunction structural member.
Figure 11:
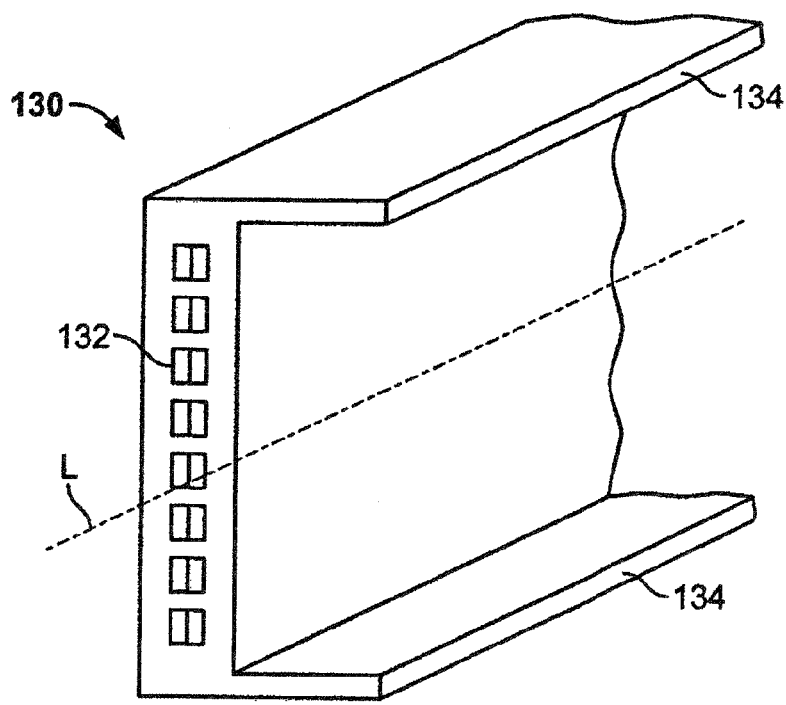
FIG. 11 is a cross-sectional view through an alternative C-shaped multifunction structural member.

In some embodiments, referring to FIGS. 3-5, structural body 100 is generally an elongate longitudinally-extending member which in one respect is like a conventional structural member except for the integrated electronics as described herein. Accordingly, structural body 100 is preferably designed, sized, and configured to be capable of withstanding substantial external applied loads such as those imposed by the weight of the electronic hardware or other components. In one of many possible embodiments as shown in FIGS. 4 and 8, structural body 100 may form a multifunction structural member with box-shaped cross-section that defines an internal cavity such as airflow conduit 75. Airflow conduit 75 is used for transporting cooling air through multifunction member 30. As shown in FIGS. 9-11, structural body 100 may have many other suitable and commonly used structural cross-sectional shapes without limitation. For example, FIG. 9 shows a possible I-shaped body 110 with embedded striplines 112 and structural stiffening flanges or projections 114 further explained herein. FIG. 10 shows a possible T-shaped body 120 with embedded striplines 122 and structural stiffening flanges or projections 124. FIG. 11 shows a possible C-shaped body 130 with embedded striplines 132 and structural stiffening flanges or projections 134. Numerous other structural shapes are possible depending on the intended application and structural and electronic design requirements.

Structural body 100 may be made of any suitable material, such as metals, plastics, composite materials, fiberglass, etc. The shape, dimensions, and material selection for body 100 will depend on a combination of structural loads to be supported by the body and electronic design factors dictated by the intended application, which is well within the ambit of those skilled in the art to determine. In one embodiment, body 100 is preferably made of made of a metal, which in a preferred embodiment may be aluminum. Since internal surfaces 61, 63 and 64, 71 above and below each circuit board 50, 80 preferably are metal or metalized to provide groundplanes for striplines 32, 34 as noted above, using a metal for structural body 100 advantageously allows the internal metal surfaces to be an integral part of the body. Accordingly, in a preferred embodiment, the stripline groundplanes are formed and defined by structural body 100 itself by integral top and bottom circuit support bases 60, 70. This approach saves manufacturing costs since a separate step or parts are not required to clad or otherwise attach metal to body 100 for internal surfaces 61, 71. This also improves reliability since thinner metal cladding may possibly be damaged during the stripline manufacturing process or become separated from body 100 during use due to differential thermal expansion or other causes.

Main airflow conduit 75 is connected to a plurality of lateral airflow outlet apertures 72 (see FIG. 3) on either side 73, 74 of body 100. Apertures 72 discharges air from main conduit 75. In one embodiment, apertures 72 may be shaped as elongated slots. Multifunction members 30 are vertically placed in frame 21 with open end 35 on the bottom in one embodiment. Air enters conduit 75 via an opening in end 35 of multifunction member 30 and is forced outwards through apertures 72 since end 36 of member 30 is preferably closed in the embodiment shown. The airflow, which may be mechanically forced through multifunction member 30 by a fan or similar apparatus in some embodiments, serves to cool the antenna array by convectively removing and dissipating accumulated heat from the electrical circuits and hardware.

Figure 6:
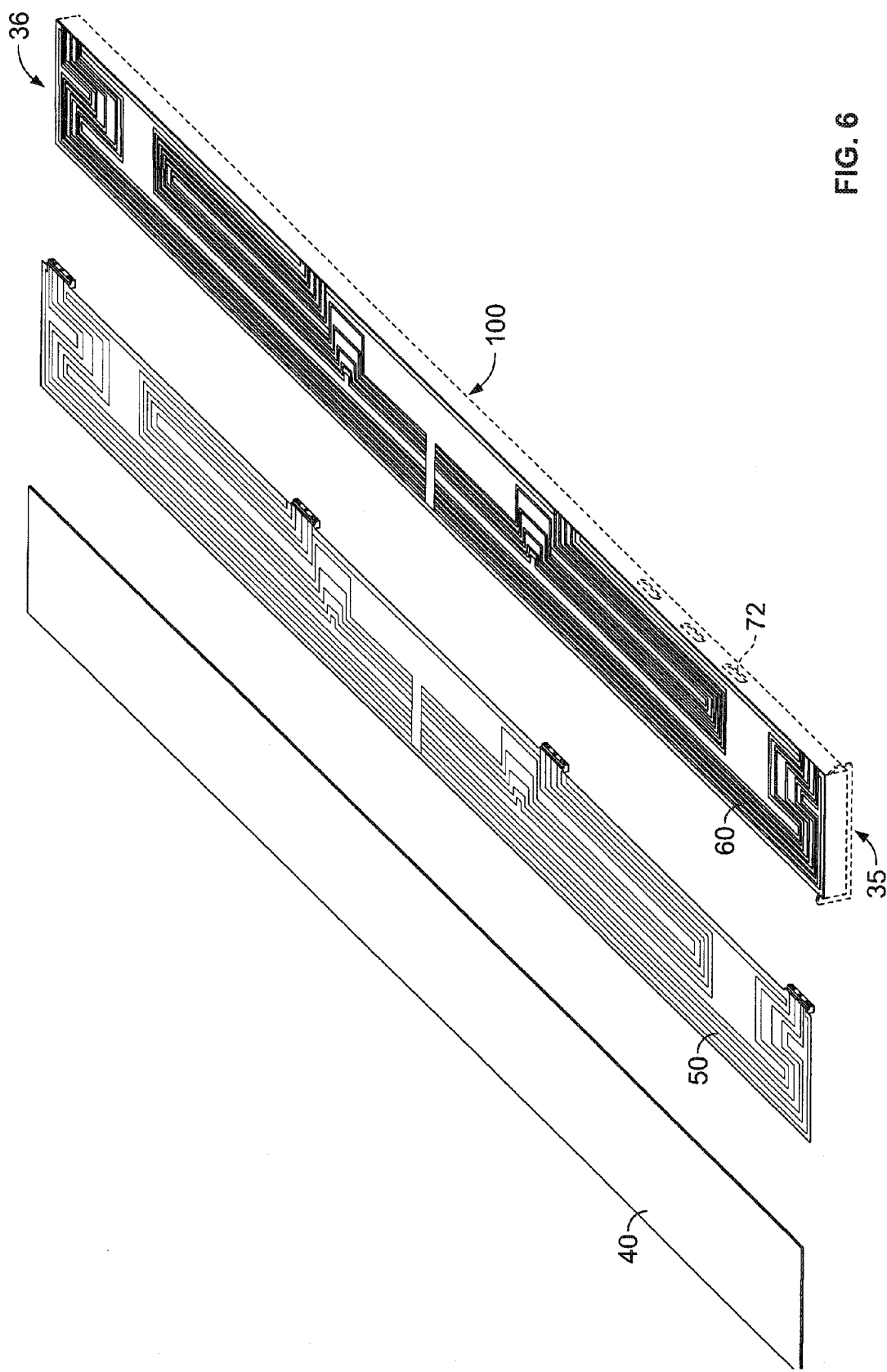
FIG. 6 is a perspective exploded view of the top stripline of FIG. 5.
Figure 7:
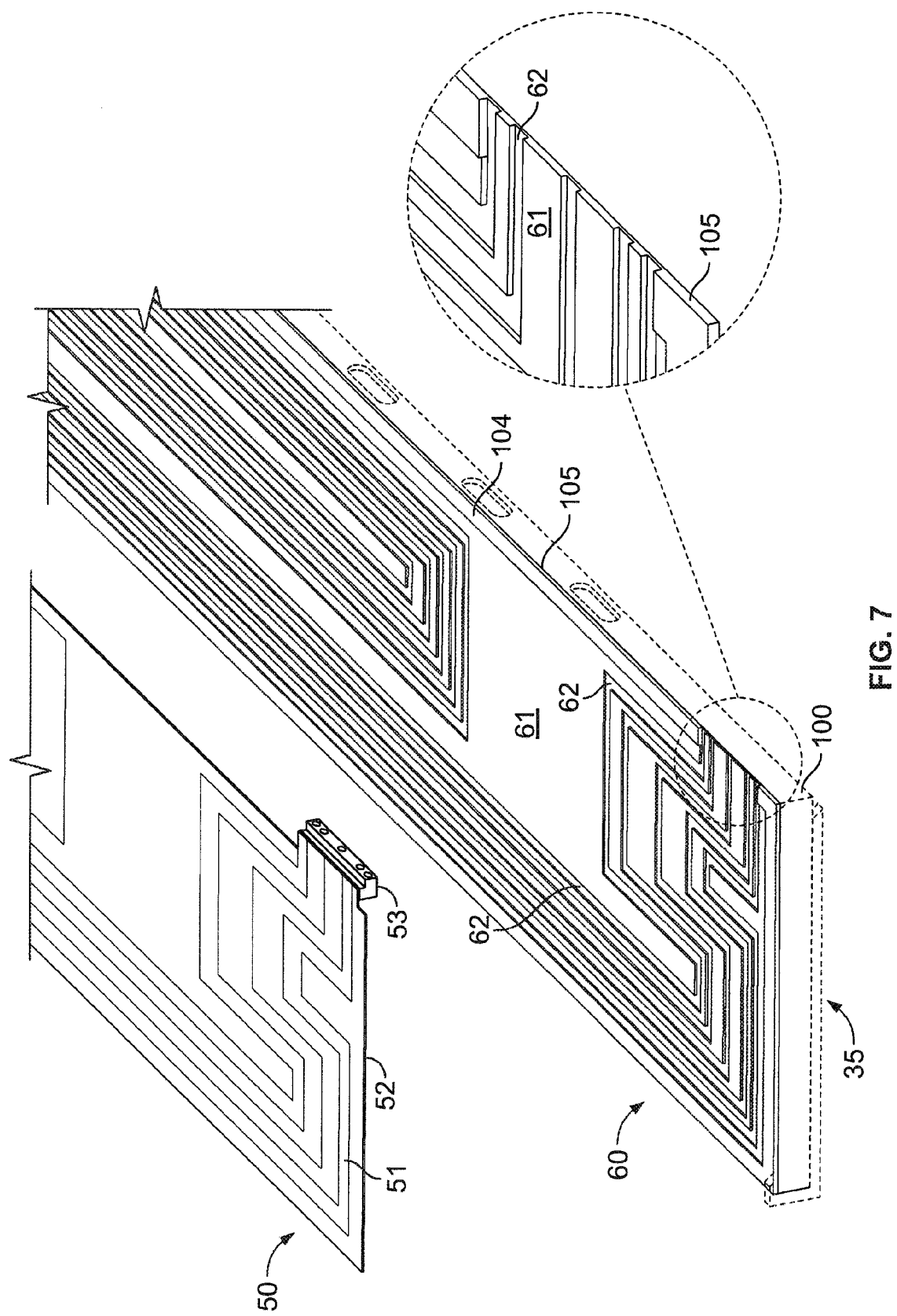
FIG. 7 is a close-up exploded perspective view of a portion of the top stripline of FIG. 6.

Referring to FIGS. 4 and 7, striplines 32, 34 of multifunction structural member 30 are integrated with and form part of structural body 100 itself. Striplines 32, 34 each include an electrical circuit formed on circuit boards 50, 80. In one embodiment, each circuit board 50, 80 includes at least one metallic layer such as copper attached to a dielectric substrate material 52 which may be made of any suitable material. In one embodiment, substrate 52 may be made of a polyimide such as Kapton® (registered trademark of DuPont Corporation). In other embodiments, a commercially-available copper clad laminate may be used for circuit boards 50, 80 such as Ultralam® 3000 (registered trademark of Rogers Corporation) that uses liquid crystalline polymer (LCP) as the dielectric. Accordingly, any number of commercially available products may be used without limitation. The metallic layer on circuit boards 50, 80 may be etched or prepared by any suitable process known in the art to produce electrical conductors 51 in any desired pattern. As shown in FIGS. 5-7, conductors 51 may be terminated with any number of suitable types of electrical interfaces or connectors 53, such as for example without limitation GPO® or GPPO® interconnects (both trademark of Corning Gilbert Incorporated). In one embodiment, connectors 53 mate and connect to other complementary-configured electrical connectors such as electrical connectors 26 on brackets 24 in the antenna array to provide power/energy or process signals to/through circuit boards 50, 80. It should be noted that a single circuit board 50, 80 may each include one or more circuits formed by multiple electrical conductors 51 and connectors 53.

With continuing reference to FIG. 4, circuit boards 50, 80 are each covered by top and bottom covers 40 and 90, respectively, that complete striplines 32, 34 and effectively embed the striplines into structural body 100. Accordingly, in one embodiment, striplines 32, 34 are an integral part of structural body 100. Covers 40, 90, circuit boards 50, 80, and circuit support bases 60, 70 respectively may be coupled or joined together to form the striplines by any suitable means such as without limitation solder reflow, laser welding, resistance seam welding, epoxy or other adhesives, mechanical fasteners (screws, rivets, etc.) and combinations thereof. The process selected will depend on factors such as the types of materials used for these components and cost.

FIGS. 5-7 show top stripline 32 with top circuit board 50, top cover 40, and top circuit support base 60 of structural body 100 in an assembled and exploded view, respectively. The orientation of multifunction structural member 30 is reversed 180 degrees from that shown in FIG. 3 so that electrical connectors 53 on the rear side 73 of structural body 100 are visible. FIG. 7 shows a close-up exploded view of circuit board 50 and circuit support base 60. In a preferred embodiment, top circuit support base 60 is actually defined by an upper portion of structural body 100. Accordingly, structural body 100 itself forms a constituent part of stripline 32 or other electronics circuit that may be provided. Circuit support base 60 has a generally planar surface 61 which includes a plurality of channels 62 recessed into the surface. Surface 61 may be flush with the edges 105 of circuit support base 60 in some embodiments. In a preferred embodiment, surface 61 is recessed below the edges 105 of circuit support base 60 to effectively form a raised border 104 around the base for receiving circuit board 50 therein. In one possible non-limiting embodiment illustrating a possible construction, for example, circuit support base 60 may have a total thickness of about 0.03125 inches, with surface 61 recessed about 0.0027 inches below border 104 and channels 62 being about 0.020 inches below the border. Continuing with this example, circuit board 50 in one embodiment may have a total thickness of about 0.0027 inches so that the top of the circuit board is approximately flush with border 104 when placed on top of circuit support base 60. In one non-limiting example, top cover 40 may have a total thickness of about 0.03125 inches so that the assembled total thickness of stripline 32 would be about 0.0625 inches.

Preferably, surface 61 of circuit support base 60 including channels 62 (sides and bottom) are all made of or clad with metal (metalized) as noted herein to form groundplanes for stripline 32 (see FIGS. 4 and 7). Channels 62 may be formed in surface 61 on structural body 100 by any suitable means. In one possible embodiment, channels 62 are formed by machining surface 61 of body 100. In other embodiments where body 100 may be made by casting, channels 62 may be formed during the casting process by incorporating the desired size and shape in the casting mold.

In a similar fashion to the top circuit support base 60, a lower portion of structural body 100 may also define bottom circuit support base 70 with channels 62 also provided therein as shown in FIG. 4.

Channels 62 may be provided in any suitable pattern. In the embodiment shown in FIGS. 6 and 7, channels 62 preferably are formed into a pattern that complements and matches the pattern of conductors 51 on circuit board 50. Top cover 40 also has an inner surface 63 with channels 62 (see FIG. 4) that preferably also match the pattern of channels 62 in bottom cover 60. When air stripline 32 is assembled as shown in FIG. 5, channels 62 in top cover and bottom covers 40, 60 effectively match up on either side of conductor 51 and provide an air gap on either side of the conductor for the stripline. Conductor 51 is essentially "suspended" in air between top cover 40 and top circuit support base 60 and forms a dielectric (see, e.g., section 4-4 taken in FIG. 7 and shown in FIG. 4). In other embodiments, channels 62 need not be provided and any suitable commercially-available dielectric materials may be used to produce striplines 32, 34.

Stripline 34 with its component parts bottom cover 90, circuit board 80, and circuit support base 70 (see FIG. 4) are preferably made in a similar manner to stripline 32 and its component parts described herein. When striplines 32, 34 are fully integrated with structural body 100 with top and bottom covers 40, 90 in place, an essentially single monolithic unit or member is created combining mechanical/structural support, cooling, and electronic functions in a novel, efficient, and cost-effective manner. In one embodiment, striplines 32, 34 are irremovably incorporated and integrated with structural body 100. In other embodiments, striplines 32, 34 may be removably coupled to body 100 such as through the use of fasteners or other types of mechanical and locking connections.

Although embodiments of a suspended air type stripline are disclosed herein, other types and configurations of striplines including the use of other suitable dielectric materials, stacking of multiple striplines or electrical circuits in multi-layer fashion, etc. are also contemplated. Accordingly, the invention is not limited for use with suspended air striplines alone. Moreover, multifunction structural members according to principles of the present invention may be used to provide members incorporating any type of electronic or microwave circuits. The types of electrical circuits that may be incorporated with structural members according to the present invention may include electronic and electrical such as without limitation striplines, microstrips, coplanar waveguides, power busses, digital busses, and virtually any other type of electrical/electronic circuits that would be suitable for embedding as described herein. In addition, RF, digital, power, or other types of cables may also be embedded and encapsulated in structural body 100 in a similar manner to constructing the striplines described herein to dress, protect, and get the cables out of the way.

It should be noted that two or more multifunction structural members of any shape with embedded electronics may be joined together in any suitable manner to form any combination of larger structural units or assemblies.

It will be appreciated that electrical circuit boards and striplines are typically generally flat, relatively thin, and structurally weak being sometimes made of dielectric materials such as various polymers or composites that are not designed for and incapable of sustaining significant structural loads. These factors result in circuit boards or similar hardware which are generally incapable of withstanding any substantial in-plane and out-of-plane external loads without damage or failure. For example, circuit boards are incapable of withstanding bending moments or forces normal to the plane of the board or in-plane axial loads without cracking or other damage that adversely effects electrical performance. Accordingly, it is common practice to avoid imposing any external loads directly on the circuit boards themselves. It will be appreciated that the multifunction structural members with embedded electronics described herein, however, are designed as load-bearing structures that include a plurality of stiffening flanges or projections disposed transverse to the longitudinal axis L to resist bending and twisting caused by in-plane and out-of-plane external loads. These stiffening projections generally may also be disposed at an angle to and extend outwards from the plane of the embedded circuit boards. For example, in the box beam or girder embodiment shown in FIGS. 3, 4 and 8, the sides 73, 74 of longitudinally-extending structural body 100 form stiffening projections disposed transverse to the plane of striplines 32, 34 to strengthen and stiffen multifunction member 30. Sides 73, 74 are coupled to but extend away from striplines 32, 34 at approximately a 90 degree angle as shown. Similarly in principle, in another example, I-shaped body 110 of the multifunction member shown in FIG. 9 includes stiffening projections 114 that also extend transverse to and at a 90 degree angle outwards/away from stripline 112 embedded in a central portion of the body (see also FIGS. 10-11). As with conventional I-beam structural members, stiffening projections 114 form the flanges and embedded stripline 112 forms the main load-bearing web of I-beam-shaped structural body 110. Accordingly, these integral stiffening projections differentiate the multifunction members disclosed herein from the generally non-load bearing flat electrical circuit boards that extend generally in only one plane and are incapable of withstanding substantial out-of-plane loads applied perpendicular/normal or at an angle to the plane of the circuit boards or in-plane loads applied along the edges of the circuit boards. It should be noted that stiffening projections may be disposed at any suitable angle to the circuit boards or striplines without limitation depending on the intended application and design requirements. In addition, any suitable combination of stiffening projections or shapes may be used based on the intended application requirements.

Based on the foregoing discussion contrasting multifunction members 30 from ordinary circuit boards, it will further be appreciated that multifunction structural body 100 will have an overall configuration different than the electrical circuit board alone and have an overall size larger than the individual circuit board or boards. In one non-limiting example with reference to FIGS. 4 and 8, stripline 32 (comprised of top cover 40, circuit board 50, and circuit support base 60) may have a total thickness of about 0.0625 inches. Sides 73, 74 of structural body 100, which form stiffening projections, preferably each has a depth (measured in a direction between and perpendicular to striplines lines 32 and 34 transverse to longitudinal axis L) at least about the same as or more preferably larger than the total thickness 0.0625 of stripline 32 alone to add strength and rigidity to multifunction member 30. In a preferred embodiment, sides 73, 74 each have depth at least about twice the total thickness of stripline 32. Referring to FIGS. 9-11 showing various multifunction members of differing cross-sectional structural shapes, in other non-limiting examples, stiffening projections or flanges 114, 124, 134 each preferably have a depth (measured transverse to longitudinal axis L and perpendicular to striplines 112, 122, 132) that is at least about twice the total thickness of striplines 112, 122, 132 (measured horizontally and transverse to longitudinal axis L). It will be appreciated that the stiffening projections may have any suitable depth depending on the intended external design loads expected and application.

A method of forming a multifunction structural body with embedded electronics will now be described with reference to FIGS. 4-7 and using top stripline 32 as an non-limiting example for convenience. The method includes establishing a first groundplane such as circuit support base 60 on structural body 100, by either applying a metal cladding to body 100 if not of a suitable metallic material for the intended groundplane or providing a body 100 made of an acceptable metal for the groundplane. Next, an electrical circuit is layered on the first groundplane on body 100. In some embodiments, the circuit may be an electrical circuit board 50 having substrate 52 with metallic conductor 51 provided on at least one side of the substrate. Circuit board 50 may now be attached (either permanently bonded or removably) to circuit support base 60 and/or body 100 by any suitable means already described herein. Alternatively, circuit board 50 may simply be layered on support base 60 and secured the support base and/or body 100 later.

With continuing reference to FIGS. 4-7, a second groundplane is next layered on top of circuit board 50, which is some embodiments may be top cover 40 that includes a metallic surface which faces the circuit board and forms the second groundplane. Top cover 40 may now be attached (either permanently bonded or removably) to circuit board 50 and/or body 100 by any suitable means already described herein. Alternatively, both circuit board 50 and top cover 40 may be attached to circuit support base 60 and/or body 100 in a single step at the same time by any suitable means already described herein. Stripline 32 has now been assembled and integrated with structural body 100. The embedded electronics form a portion of structural body 100 and form an integral part of the body, which is now essentially an electrically-active multifunction structural member. Electrical connectors 53 on circuit board 50 preferably remain accessible to be connected to mating electrical connectors for providing power/energy or process signals through circuit boards 50, 80. Stripline 34 may be created on an opposite side of structural body 100 in a manner similar to that just described.

According to another aspect of the invention, non-load bearing structures having integrated electronics may be provided to serve as removable covers or access panels (not shown) for electronics equipment. The electronics may be incorporated or embedded into the covers during the design and fabrication stage in the same manner as described above for load-bearing structural shapes.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof. One skilled in the art will appreciate that the invention may be used with many modifications of structure, arrangement, proportions, sizes, materials, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

What is claimed is:

1. A multifunction structural member with integrated electronics comprising:
    an elongate metallic structural body configured to support an applied external structural load, the structural body including a first support base defining a first electrical groundplane; and
    a first circuit board layered on top of the first groundplane and having an electrical conductor;
    wherein the first circuit board is embedded within the first support base to define a stripline such that opposing top and bottom planar surfaces defining the first circuit board are covered by the first support base along their lengths, and wherein the body includes a stiffening projection to strengthen the body, the first support base and the stiffening projection defining a T-shape cross-section.

2. The member of claim 1, wherein the first support base and the first circuit board are irremovably joined together to form a monolithic single unit that is electrically active.

3. The member of claim 1, wherein the stiffening projection and the first support base are integrally formed.

4. The member of claim 1, further comprising a second stiffening projection, wherein the first stiffening projection and the second stiffening projection are arranged on opposite ends of the support base such that the support base and the first and second stiffening projections define an I-shape cross-section.

5. A multifunctional structural member with embedded electronics comprising:
    an elongate longitudinally-extending structural body configured to support a structural load and having at least one metal support base defining a first circuit base;
    at least one stiffening projection disposed on the support base, the at least one stiffening projection and the support base formed as a continuous piece of material; and
    a first electrical circuit supported by the first circuit base and embedded within the support base such that opposing top and bottom planar surfaces defining the electrical circuit are covered by the support base along their lengths;
    wherein the at least one stiffening projection is oriented generally perpendicular to a planar surface of the support base, the at least one stiffening projection extending in the elongated direction of the support base such that the stiffening projection and the support base define a T-shape cross-section.

6. The member of claim 5, wherein the electrical circuit is disposed on a circuit board including a dielectric substrate and a metallic electrical conductor supported by the substrate, the metal support base of the structural body defining a groundplane.

7. The member of claim 5, wherein the at least one stiffening projection comprises a first and a second stiffening projection, and the support base and the first and second stiffening projections define an I-shape cross-section.

8. A multifunctional structural member with electronics comprising:

a longitudinally-extending structural body defining a longitudinal axis and being capable of supporting external applied loads, the body including at least one integral stiffening projection for strengthening the body and a support base; and at least one electrical circuit embedded within the support base such that opposing top and bottom planar surfaces defining the at least one electrical circuit are covered by the support base along their lengths to form an electrically-active structural member capable of withstanding the external applied loads;

wherein the entire support base and the stiffening projection define a T-shape cross-section.

9. The multifunction member of claim 8, wherein the structural body includes electrical connectors coupled to the embedded circuit.

10. The multifunction member of claim 8, wherein the body is made of a metal and the body forms part of the embedded electrical circuit.

11. The multifunction member of claim 8, wherein the electrical circuit contains an electrical conductor made of metal, and wherein the body is made of a metal and the body forms part of the embedded electrical circuit, the metal used to make the body being different than the metal used to make the conductor.

12. An antenna structure or module comprising:

a frame; and at least one multifunction structural member with integrated electronics mounted in the frame, the at least one member comprising:

an elongated monolithic body configured to support an applied external structural load, a support base of the body defining a first electrical groundplane;

a stiffening projection arranged generally perpendicular to a planar surface defined by the support base;

a first circuit board layered on top of the first groundplane and having an electrical conductor;

wherein the first circuit board is embedded within the support base to define a stripline such that opposing top and bottom planar surfaces defining the first circuit board are covered by the support base along their lengths, and wherein the entire support base and the stiffening projection define a T-shape cross-section.

* * * * *